United States Patent
Knopfle et al.

(10) Patent No.: US 9,865,485 B2
(45) Date of Patent: Jan. 9, 2018

(54) APPARATUS AND METHOD FOR DETERMINING THE LOCATION OF PLATE ELEMENTS OF A WAFER BOAT

(75) Inventors: Daniel Knopfle, Ringingen (DE); Andreas Hartmann, Allmendingen (DE); Ottmar Graf, Bergatreute (DE)

(73) Assignee: CENTROTHERM PHOTOVOLTAICS AG (DE)

( * ) Notice: Subject to any disclaimer, the term of this patent is extended or adjusted under 35 U.S.C. 154(b) by 1139 days.

(21) Appl. No.: 13/642,891

(22) PCT Filed: Apr. 27, 2011

(86) PCT No.: PCT/EP2011/002115
§ 371 (c)(1),
(2), (4) Date: Jul. 1, 2013

(87) PCT Pub. No.: WO2011/134653
PCT Pub. Date: Nov. 3, 2011

(65) Prior Publication Data
US 2013/0272825 A1    Oct. 17, 2013

Related U.S. Application Data

(60) Provisional application No. 61/359,394, filed on Jun. 29, 2010.

(30) Foreign Application Priority Data

Apr. 27, 2010    (DE) .................... 10 2010 018 465

(51) Int. Cl.
*H01L 21/67*    (2006.01)

(52) U.S. Cl.
CPC ............................ *H01L 21/67265* (2013.01)

(58) Field of Classification Search
CPC .................... H01L 21/67265; H01L 21/67259
See application file for complete search history.

(56) References Cited

U.S. PATENT DOCUMENTS

| 5,225,691 A |   | 7/1993 | Powers et al. |
|---|---|---|---|
| 5,291,025 A | * | 3/1994 | Smith .................... G01B 11/02 250/237 G |
| 5,595,522 A | * | 1/1997 | Simpson ................. B24B 9/065 414/941 |

(Continued)

*Primary Examiner* — Anna Momper
*Assistant Examiner* — Mark Hageman
(74) *Attorney, Agent, or Firm* — Tarolli, Sundheim, Covell & Tummino LLP

(57) ABSTRACT

An apparatus and method determines the location of wafer boat plate elements having a plurality of plate elements arranged substantially parallel to each other. At least three sensors are moved along travel paths perpendicular to the plate elements, wherein at least a first travel path is above, at least a second travel path is below the wafer boat and at third travel path is laterally spaced from the first or second travel paths above or below the wafer boat. During this movement the position of the sensors along a respective travel path is determined continuously, and it is determined, in which position a respective plate element enters the measuring area of a sensor and exits the same. A distance between a sensor and an edge of a plate element is measured and the location of a respective plate element is determined by means of the sensor signals.

13 Claims, 14 Drawing Sheets

(56) References Cited

U.S. PATENT DOCUMENTS

| | | | |
|---|---|---|---|
| 5,798,532 A * | 8/1998 | Linehan | H01L 21/67288 250/559.22 |
| 5,850,290 A * | 12/1998 | Horiguchi | A61B 5/1077 356/602 |
| 6,052,193 A * | 4/2000 | Kim | H01L 21/67265 250/559.4 |
| 6,147,356 A * | 11/2000 | Hahn | H01L 21/681 250/559.29 |
| 6,208,909 B1 | 3/2001 | Kato et al. | |
| 6,760,115 B2 * | 7/2004 | Shimizu | G01B 11/24 356/237.1 |
| 7,112,812 B2 * | 9/2006 | Schauer | G01B 11/005 250/559.29 |
| 9,111,978 B2 * | 8/2015 | Mori | H01L 21/67259 |
| 2004/0012363 A1 * | 1/2004 | Simondet | B25J 9/1692 318/568.21 |
| 2004/0075822 A1 * | 4/2004 | Hattori | G03F 7/7075 355/72 |
| 2005/0035313 A1 | 2/2005 | Garssen et al. | |
| 2005/0242305 A1 | 11/2005 | Oka | |
| 2008/0100852 A1 * | 5/2008 | Iida | H01L 21/67265 356/634 |
| 2009/0133628 A1 | 5/2009 | Dahl et al. | |
| 2010/0179681 A1 * | 7/2010 | Jager | H01L 21/67265 700/214 |

\* cited by examiner

Fig. 12
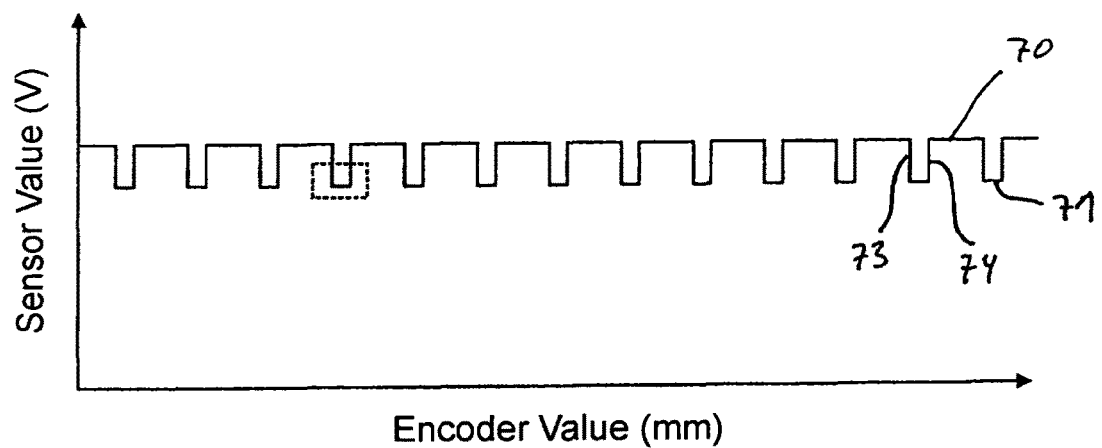
(A)
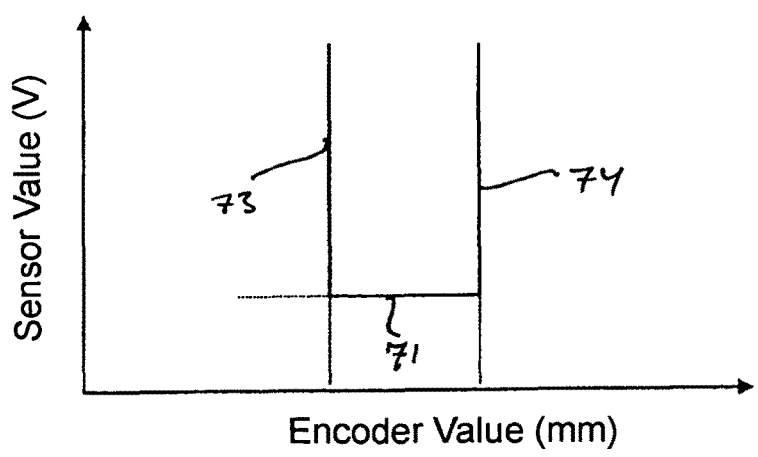
(B)

Fig. 13
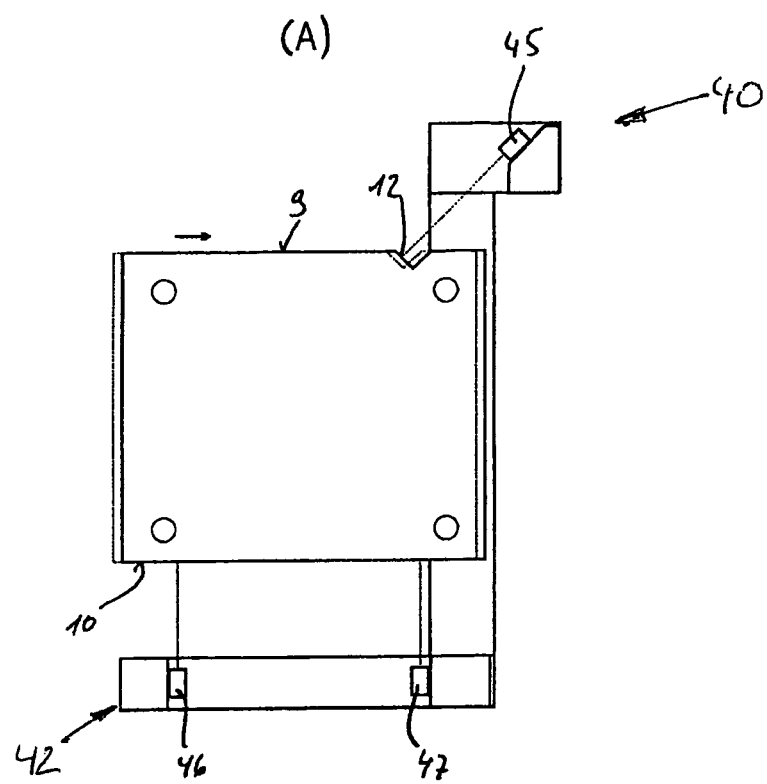
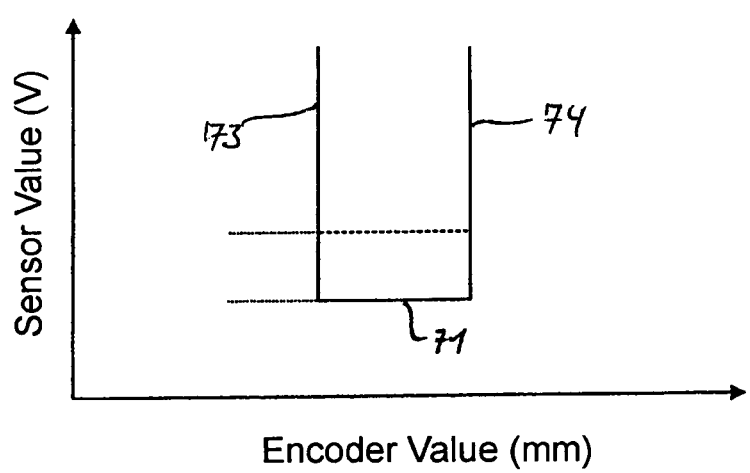

APPARATUS AND METHOD FOR DETERMINING THE LOCATION OF PLATE ELEMENTS OF A WAFER BOAT

The present invention relates to an apparatus and a method for determining the location of plate elements of a wafer boat consisting of a plurality of plate elements, which are arranged substantially parallel to each other and may form receiving slots for receiving wafers between adjacent plate elements. The invention also relates to a loading apparatus and a method for loading such a wafer boat.

It is known in the art of semiconductors and solar cells to expose disk-shaped substrates of different materials, referred to as wafers herein below, to different processes.

The wafers are often exposed to both individual treatment processes and batch processes, i.e. processes, in which several wafers are treated simultaneously. Wafers need to be brought into a respective desired treatment position for both individual processes and batch processes. In batch processes this is generally done by inserting the wafers into so-called boats comprising receptacles for a plurality of wafers. In these boats wafers are generally arranged parallel to each other. Such boats may be of different designs, and often they receive only the bottom edges of the respective wafer, so that wafers are standing freely. Such boats may comprise for example insertion chamfers, to facilitate the insertion of the bottom edges of the wafers into the boats.

With another type of wafer boats, such as the type known for plasma nitriding wafers in the solar cell technology, the wafer boat is formed by a plurality of electrically conducting plate elements. The plate elements are arranged generally parallel to each other and receiving slots for receiving wafers are formed between adjacent plate elements. Each side of the plate elements facing another plate element comprises corresponding receptacles for wafers. Therefore, a wafer can be received on each corresponding side of the plate elements comprising receptacles. Thus two wafers can be received in each receiving slot. In such wafer boats wafers are fully received between the plate elements. Plate elements of such boats consist of an electrically conducting material, usually graphite. Adjacent plate elements of a wafer boat are electrically insulated with respect to each other and may be biased with different biasing voltages during the process. This facilitates forming a plasma between the substrates held by the respective plate elements, so as to provide a plasma treatment, such as plasma nitriding.

A high precision is required for loading and unloading such a boat since wafers need to be carried over a relatively large distance in a parallel and closely distanced manner with respect to the corresponding plate elements. In order to facilitate this, it is known to mechanically lock boats in a defined position for loading/unloading, and to train a loading/unloading robot on this position.

However, there is the problem that with continuous operation several boats are moving across a process plant, each of which may be differently distorted or twisted. Reasons for this may be thermal stress or an unprecise assembly of the boats. Ahead of each process a loading/unloading robot would need to be trained on each single one of the boats, which is very complex and expensive.

Also the positions of the plate elements with respect to each other could change over time due to slackening of clamping elements with respect to each other. This causes the problem that even with the boats being placed in a specific starting position the plate elements are not necessarily in a precisely known position. During the loading and/or unloading operation exercised by a loading/unloading robot wafers cannot be loaded/unloaded in a sufficiently precise manner. Thus damages to the substrates and/or the wafer boat may occur.

Moreover it would be preferable not to lock or clamp wafer boats, so as to avoid the consequences of mechanical and in particular thermal stress. However, without clamping further imprecision with respect to the positioning of wafer boats may arise.

Thus it was suggested to use several high-resolution cameras and projected laser beams for determining the position of wafer boats. Such solutions are sensitive to ambient light and also very expensive.

The present invention thus aims at providing an apparatus and a method for determining the location of plate elements in a wafer boat. Another task to be solved is seen in providing a loading apparatus and a method for loading a wafer boat.

According to the invention an apparatus and a method for determining the location of plate elements in a wafer boat is provided according to claim 1 and claim 12, respectively. Further a loading apparatus as well as a method for loading a wafer boat are provided according to claim 11 and claim 25, respectively. Claims 28 and 30 provide an alternative apparatus and method respectively for determining the position of the plate elements of a wafer boat. Further embodiments of the invention are claimed in the respective dependent claims.

In particular an apparatus is provided for determining the location of plate elements of a wafer boat having at least two, i.e. a plurality, of plate elements, which are arranged substantially parallel to each other and may form receiving slots for receiving wafers between adjacent plate elements. The apparatus comprises a receptacle for receiving the wafer boat in a predetermined orientation, a sensor array having at least three sensors each sensor being adapted to measure the distance between the sensor and the top or bottom edge of the plate element along a measurement direction, at least one support and movement unit for supporting and moving the sensors along predetermined travel paths perpendicular to the plate elements and at least one unit for determining the position of the sensors along the respective travel paths. A first travel path is preferably above a wafer boat placed on the receptacle, a second travel path is preferably below a wafer boat placed on the receptacle and a third travel path is either above or below a wafer boat placed on the receptacle, with the third travel path being laterally distanced to the first and second travel path. The sensors are each directed towards a top or bottom edge of the plate elements.

Such an apparatus is capable of determining the location of the individual plate elements of a corresponding wafer boat in an easy and cost-effective manner. By providing three distance sensors arranged in the described manner the respective location of a plate element may be determined with high precision. This may be done by moving the sensors along respective travel paths and by evaluating the respective sensor signals depending on the determined position of the sensors along the travel path. For this purpose a corresponding evaluation unit may be provided. The movability of the sensors allows for sequentially determining the location of all plate elements of the wafer boat. This in turns allows for an appropriate control of the loading unit. A mechanical clamping or locking of the wafer boat in a precise position is no longer necessary. A wafer boat should be placed, prior to determining its position, in a predetermined orientation, e.g. at a right angle to the travel paths. Here the predetermined orientation constitutes merely a coarse position of the wafer boat serving as a starting point for determining the location of the single plate elements.

The plate elements may comprise an inclined portion or a chamfer on at least one of the respective top or bottom edges in the form of a protrusion or a recess, and a first sensor may be oriented in a way that the measurement direction is substantially perpendicular to the inclined portion or chamfer. The plate elements may comprise substantially parallel top and bottom edges and a second and third sensor may be oriented in such a way that their measurement direction is substantially perpendicular to the top and/or bottom edges of the plate elements. It is preferred that the corresponding travel paths of the sensors are substantially perpendicular to the plate elements. By means of this specific array of sensors with respect to the edges and of the travel paths a high precision in the determination of the location may be achieved.

The single plate elements may be mechanically interconnected via electrically insulating elements so as to be able to provide opposing electrical biasing voltages at the plate elements.

Preferably the first sensor may be moved along the first travel path. The inclination of the first sensor allows for the sensor located above the wafer boat to be arranged laterally with respect to the receiving slot, so that it does not impair the loading unit, wherein it is assumed that the wafer boat is loaded from the top.

Furthermore, the second and third sensors may preferably move along a respective travel path below the wafer boat located on the receptacle, so that also the second and third sensors do not impair loading the receiving slots.

In one embodiment of the invention at least two of the sensors and preferably all sensors are attached to a common carrier coupled to a movement unit. Thus the construction of the apparatus is simplified and only one single movement unit is required to move all sensors. Alternatively it is also possible to provide separate carriers and movement units. The movement units may be provided with encoders, so as to be able to determine the location of the individual sensors.

In one preferred embodiment of the invention the apparatus comprises a reference plate with a fixed position comprising substantially parallel top and bottom edges according to the plate elements and comprising preferably at least one chamfer in the form of a protrusion or a recess at the top or bottom edge. Such a reference plate allows for a corresponding calibration of the sensors prior to a respective measurement, so as to be able to compensate for sensor deviations. Such sensor deviations may occur due to temperature drift of other effects. Also it is possible to provide a calibration for determining the position of the sensors.

The measurement direction of the first sensor is preferably inclined by 45° with respect to the top/bottom surface of the plate element.

The loading apparatus comprises at least one apparatus for determining the location of plate elements of the wafer boat as described above, and at least one wafer handling element, which is capable of inserting wafers into the receptacles located on the plate elements based on the determined location of the plate elements.

The method determines the location of plate elements of a wafer boat consisting of a plurality of plate elements which are arranged substantially parallel to each other and which may form receiving slots for receiving wafers between adjacent plate elements. This method comprises the following steps: arranging the wafer boat in a predetermined orientation, moving at least three sensors along predetermined travel paths perpendicular to the plate elements, wherein at least one first travel path is located above the wafer boat, at least one second travel path is located below the wafer boat and at least one third travel path is located laterally distanced to the first or second travel path above or below the wafer boat, and wherein each of the sensors is directed at a top or bottom edge of the plate elements. During the movement of the sensors the position of the sensors along each corresponding travel path is continuously determined and it is determined in which position a corresponding plate element enters and exits a measuring area of a sensor, a distance between a corresponding sensor and an edge of the plate element is measured and the location of a plate element is determined based on the sensor signals. Such a method provides the advantages already mentioned above.

The plate elements may comprise a chamfer on at least one of the respective top or bottom edges in the form of a protrusion or a recess, and accordingly a first sensor may be oriented in a way that its measurement direction is substantially perpendicular to the chamfer. The plate elements may have substantially parallel top and bottom edges and a second and third sensor may be oriented in such a way that their measurement direction is substantially perpendicular to the top and/or bottom edges of the plate elements. It is preferred that the movement of the sensors is substantially perpendicular to the plate elements.

Preferably, the first sensor is moved along a first travel path, the second sensor is moved along a second travel path and the third sensor is moved along a third travel path located below a wafer boat. Thus all sensors may be located outside of a loading/unloading area of the receiving slots.

In one embodiment all sensors are moved via a common movement mechanism. Alternatively, they may also be moved via separate moving mechanisms.

In one embodiment of the invention, the sensors are first moved for calibration purposes across a reference plate, which preferably comprises substantially parallel top and bottom edges corresponding to the plate elements and comprising at least one chamfer in the form of a protrusion or a recess on the top or bottom edge, wherein during the movement it is recorded, in which position along the respective travel path the sensors detect the entry and exit of the reference plate into and out of the measuring area of the sensors and wherein the distance between a corresponding sensor and an edge of the reference plate is measured. By this means an initialization and calibration may be achieved. Also, the position of the reference plate may be used as a reference position for the successive location determination of individual plate elements.

The detection of the entry and/or exit of the plate element and/or the reference plate may be done via determination of a threshold value.

In one embodiment, laterally spaced segments of the wafer boat are sequentially measured, wherein the wafer boat may be moved sideways between the measurement of laterally adjacent segments, so as to get the respective segment into the movement zone of the sensors. Alternatively the sensors may be slidable or shiftable in a lateral direction.

In the method for loading/unloading a wafer boat of the type mentioned above, first the location of the plate elements is determined as described above and subsequently the determined location of the plate elements is transmitted to a loading unit controlling a loading/unloading handling element according to the location information so as to load/unload the wafer boat.

The location information of a plate element may be transmitted to the loading/unloading unit directly after its determination, and the loading/unloading unit can immediately load/unload the receiving slot adjacent to the plate element whose location was determined while the location of other plate elements is being determined. Alternatively the determination of the location of the plate elements and the loading/unloading of receiving slots may be done segment by segment.

The invention is further described below with reference to the drawings; in the drawings.

Figure 1:
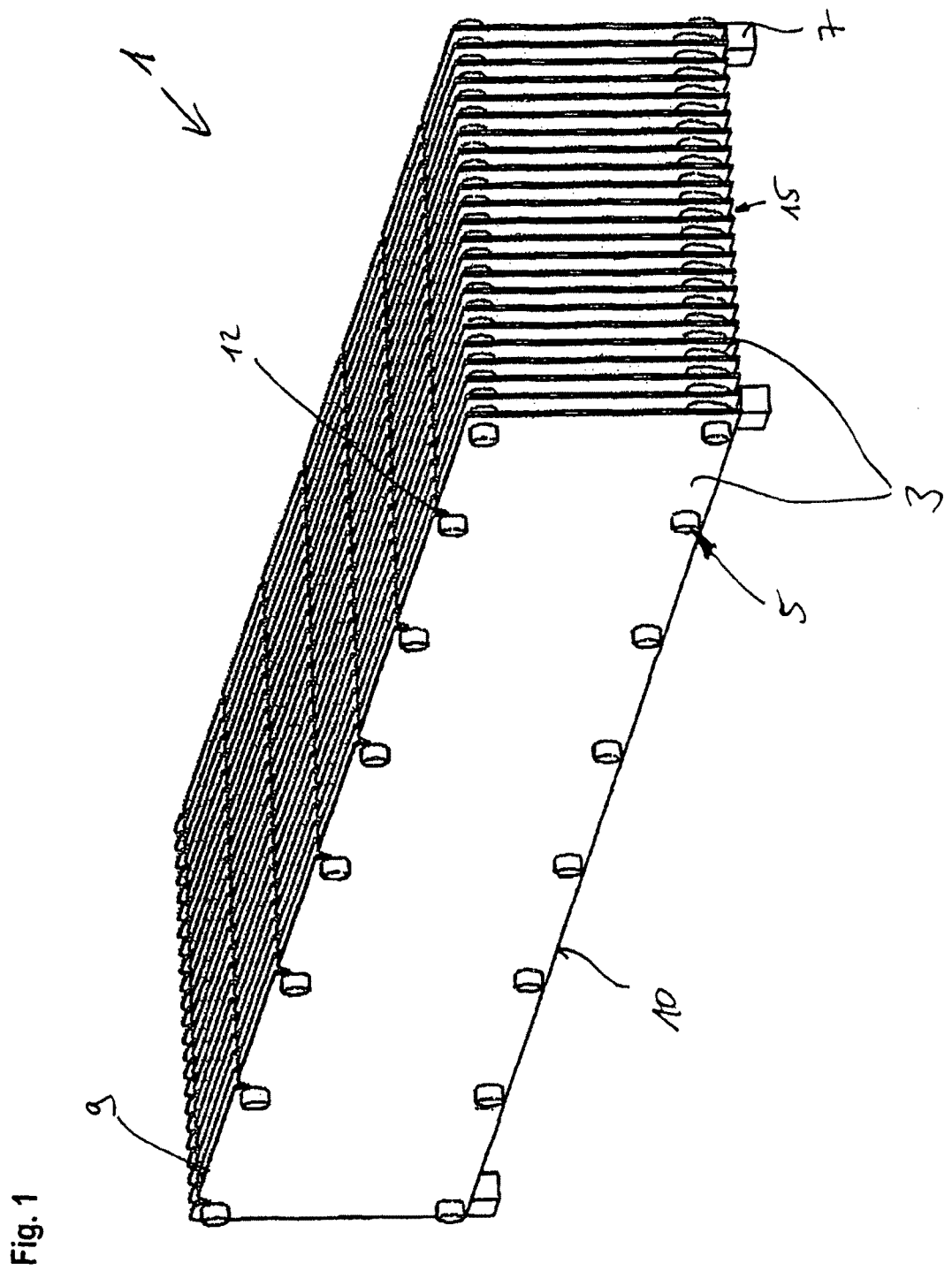
FIG. 1 is a diagrammatic perspective view of a wafer boat.
Figure 5:
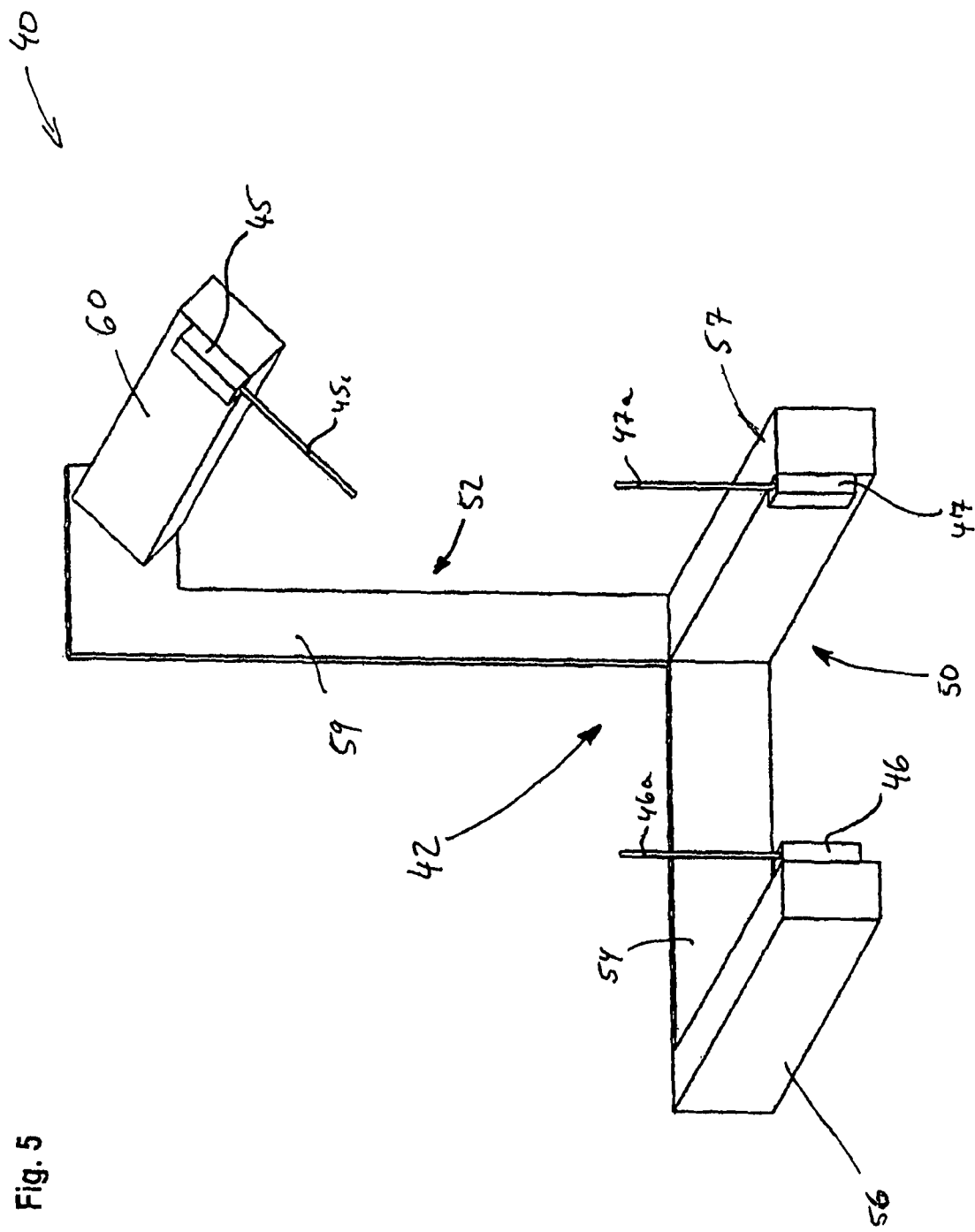
FIG. 5 is a diagrammatic perspective view of an apparatus for measuring the location of a wafer boat.
Figure 11:
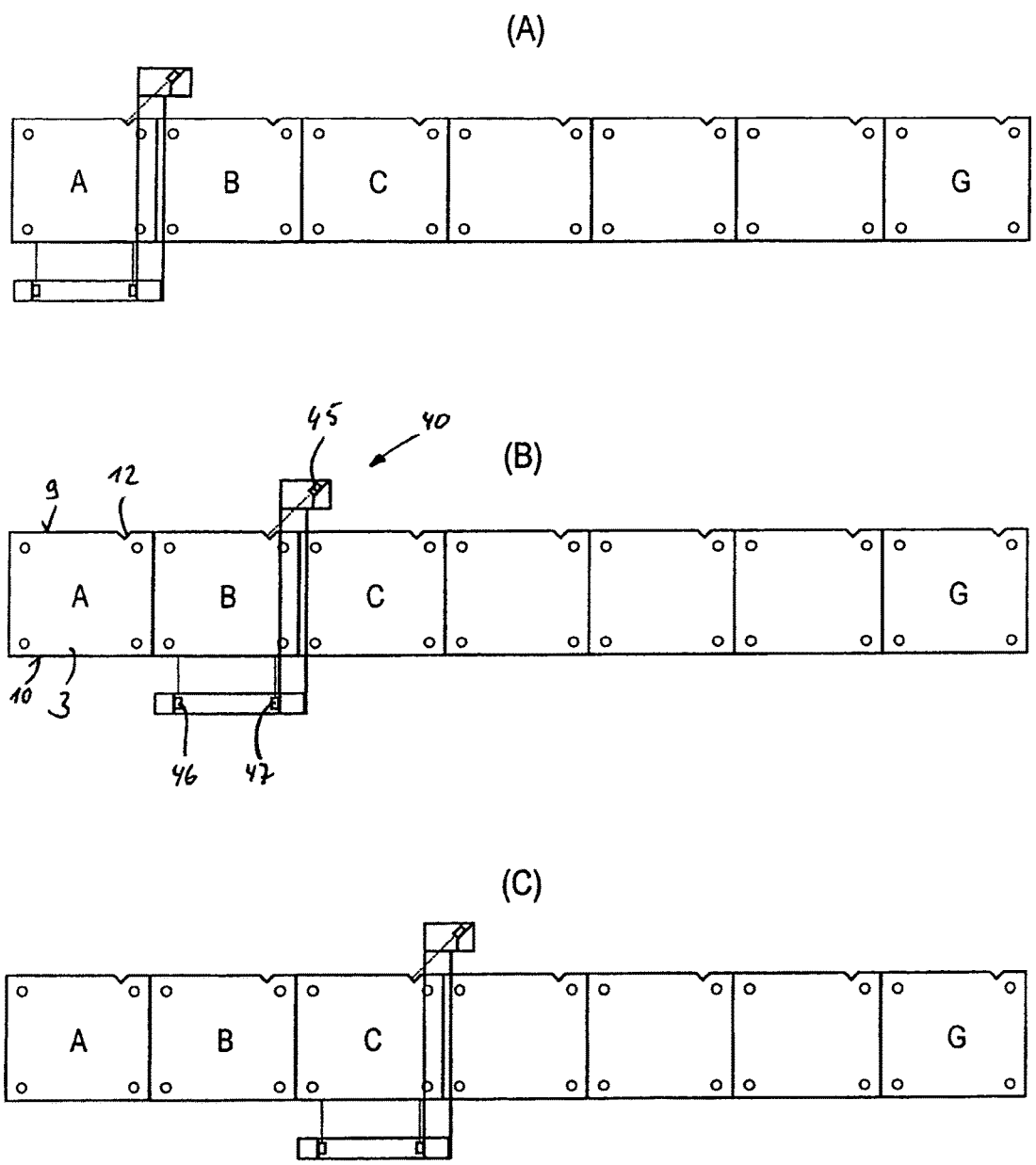
Figure 14:
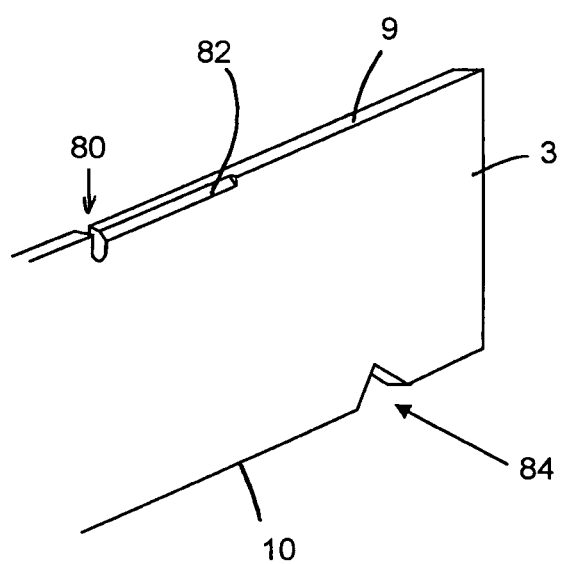

FIG. 11A-C is a diagrammatic front view of the apparatus of FIG. 5 when measuring different segments of a wafer boat of FIG. 1;

FIG. 12A is an exemplary output signal of a distance sensor depending on a position signal; and FIG. 12B is an enlarged section of the sensor signal;

FIG. 13A is a diagrammatic front view of an apparatus of FIG. 5 when determining the location of a plate element of a wafer boat shifted in a lateral direction; and FIG. 13B is an enlarged detailed view of a sensor signal of the apparatus of FIG. 13A; and FIG. 14 is a diagrammatic perspective view of a portion of an alternative plate element of a wafer boat.

Terms such as top, bottom, left and right used throughout the specification relate to the illustration in the drawings and are not to be viewed as limiting. However, they may describe preferred embodiments. The phrase substantially when used with respect to parallel, perpendicular or to angles should comprise deviations of ±3° and preferably ±1°.

FIGS. 1 to 4 show different views of a wafer boat 1 for receiving wafers (not shown). The wafer boat 1 is formed by a plurality of plate elements 3, a plurality of clamping and insulating units 5 and feet 7. The illustrated wafer boat 1 is particularly adapted for a plasma treatment and in particular for plasma nitriding of wafers.

The plate elements 3 are made of an electrically conducting material and are in particular formed of graphite plates. The plate elements 3 each have parallel top and bottom edges 9 and 10, respectively. Within each top edge 9 a plurality of V-shaped grooves 12 is formed. In the illustrated embodiment each plate element 3 has seven of these V-shaped grooves 12. The grooves 12 each have an inclined portion or champfer with respect to the upper surface of substantially 45°, however, other angles may be provided as well.

In the illustrated embodiment, a total of twenty-three plate elements 3 arranged substantially parallel to each other by means of the respective clamping and insulating units 5 are provided so as to form receiving slots 15 there between. With twenty-three plate elements 3, twenty-two of the receiving slots 15 are formed.

The plate elements 3 comprise groups of guiding elements (not shown) on their respective sides facing an adjacent plate element 3, e.g. in the form of three pins for receiving wafers. In a longitudinal direction of the plate elements a total of seven (according to the number of grooves 12) groups of guiding elements for receiving a semiconductor wafer is provided, as will be described in more detail herein below. Thus it is possible to position seven opposing pairs of wafers in the receiving slots 15.

The clamping and insulating units 5 substantially consist of (see FIG. 3) a screw or bolt 18, washers 20 and a nut 22. Bolt 18 and washers 20 are made of an electrically insulating material. Nut 22 may also be made of an electrically insulating material, however this is not necessary. The bolts 18 and the washers 20 could consist of ceramics. The washers 20 are preferably of the same size or thickness, so as to arrange the plate elements parallel to each other.

Bolt 18 is sized in such a way that it may extend through the corresponding openings of plate elements 3 as well as through respective washers 20 located in between. Plate elements 3 may be locked or clamped with respect to each other by means of the nut 22, as can be seen best in FIG. 3. However, other clamping and insulating units may be conceived, which arrange the plate elements substantially parallel in the manner mentioned above.

A total of sixteen clamping and insulating units 5 is provided, eight units adjacent to the top edge 9 of plate elements 3, and eight units adjacent to the bottom edge 10 of plate elements 3. Each of the clamping and insulating units 5 are equally distanced and partition the plate elements 3 into seven segments A-G in a longitudinal direction according to the groups of guiding elements and the grooves 12. The grooves 12 in the top edge 9 are each located in a peripheral region of a respective segment A-G formed in such a manner. The segments A-G formed in such a manner are also aligned with the groups of guiding elements on the respective plate elements 3.

Figure 2:
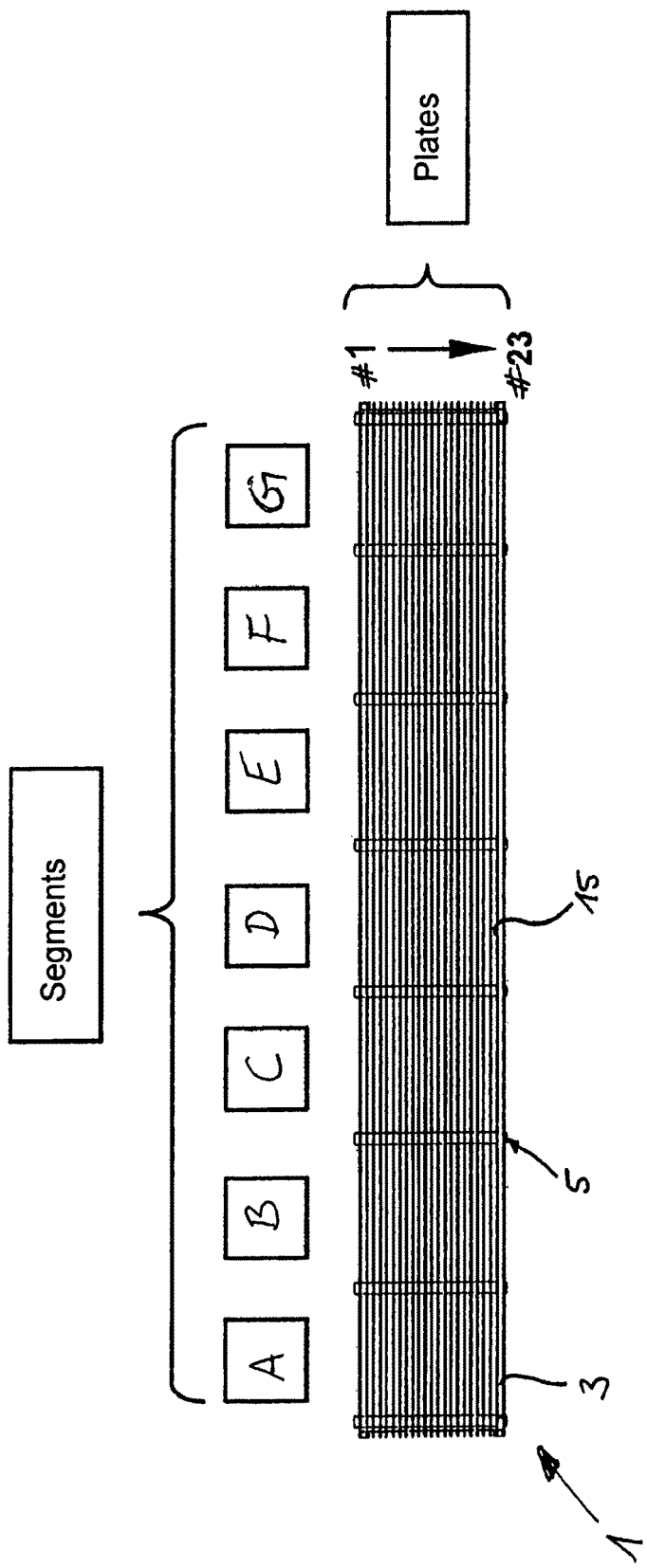
FIG. 2 is a diagrammatic top view of a wafer boat of FIG. 1.
Figure 3:
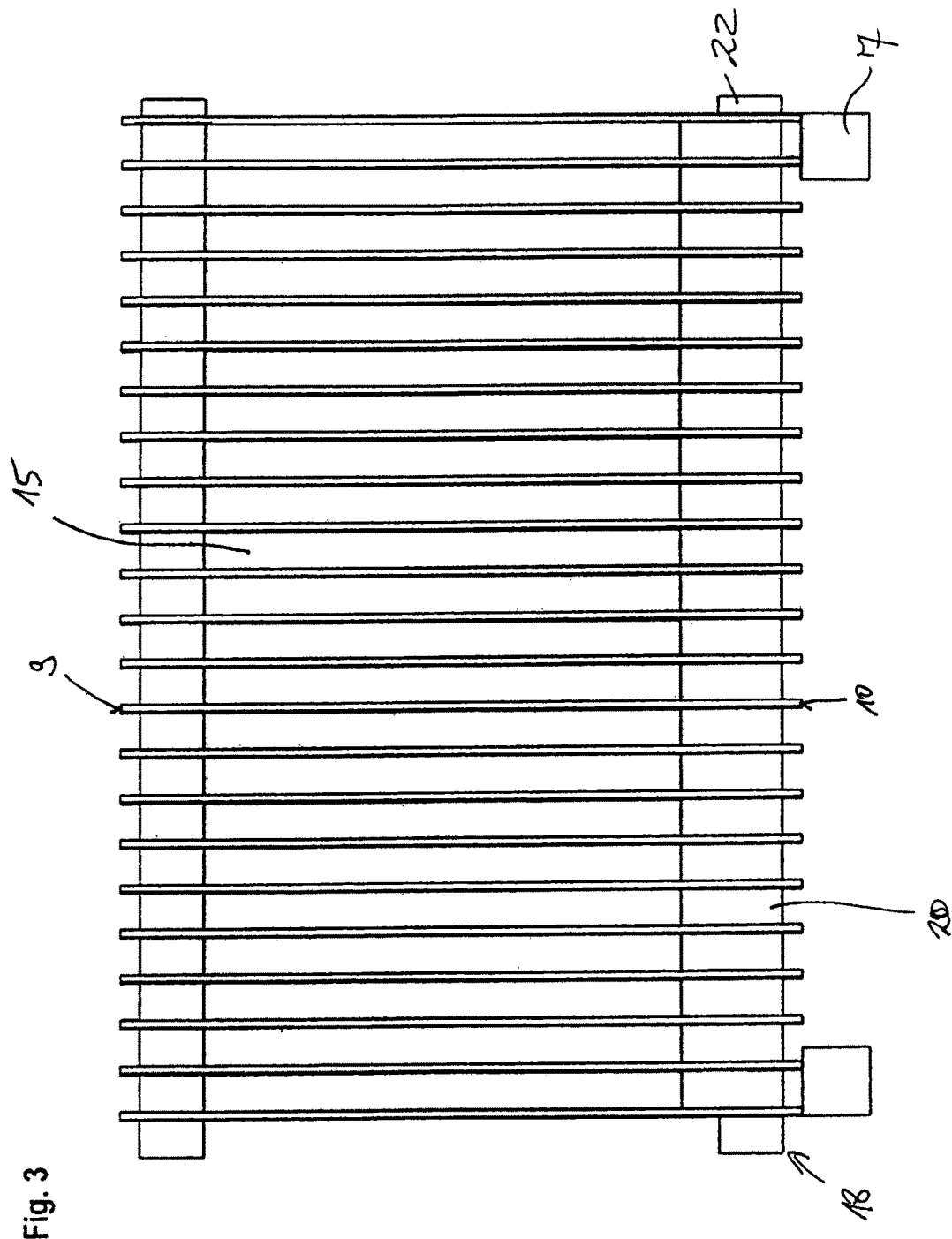
FIG. 3 is a diagrammatic side view of the wafer boat.

The twenty-two receiving slots 15 between the twenty-three plate elements 3, as well as their partition into seven segments A-G along their longitudinal direction is best seen in the top view according to FIG. 2.

Figure 4:
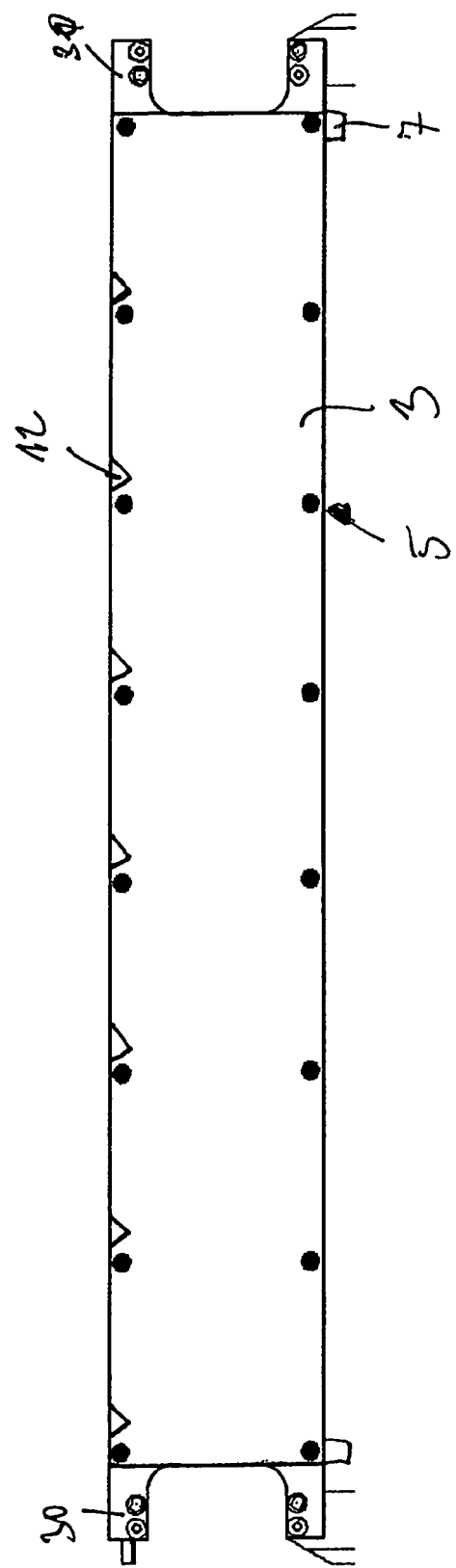
FIG. 4 is a diagrammatic front view of the wafer boat.

Further, in the front view according to FIG. 4 contact elements 30 for electrically contacting plate elements 3 can be seen. Even though this is not illustrated in detail, contact elements 30 are insulated with respect to each other and allow for adjacent plate elements to be biased with an opposing biasing voltage, as is required for the generation of a plasma in the receiving slots 15.

FIG. 5 shows a diagrammatic perspective view of an apparatus 40 for measuring the location of individual plate elements 3 of waver boat 1 described with respect to FIGS. 1 to 4 above.

The apparatus 40 substantially consists of a carrier element 42, a movement unit therefore which is not shown, three sensors 45, 46 and 47, and one analysis unit for sensor signals of the sensors, which is not shown.

The carrier element 42 has one base element 50 and one side element 52. The base element 50 substantially has the shape of a lying U with a base wall 54 and two legs 56, 57 extending perpendicular to the base wall. The legs 56, 57 extend substantially parallel to each other. On the insides of the legs 56, 57 the sensors 46, 47 are attached to the respective free ends.

The side element 52 substantially consists of a first L-shaped leg element 59 and a second leg element 60. The first leg element 59 is connected at one end in the region of leg 57 to base wall 54 or is formed integrally therewith. Leg element 59 extends towards the bottom wall 54 in a right angle and upwards towards leg 57. Leg element 59 has an L-shaped angle at its upper end. The second leg element 60 is fixedly connected to the first leg element 59 in this L-shaped angled area. The second leg element 60 extends perpendicular to the first leg element 59 and thus substantially parallel to the first and second legs 56, 57. The second leg element 60 is attached to the first leg element 59 in such a way that it forms an inclined wall surface for receiving the sensor 45. This inclined wall surface is inclined at a 45° angle with respect to the inner walls of the legs 56, 57.

Although FIG. 5 depicts the complete leg element 56 in a respective rotation, the inclined wall surface may be formed in a different way, e.g. by an appropriate machining of a leg element 60, which is otherwise arranged in a straight orientation.

Sensors 45, 46 and 47 are attached to the respective legs 56, 57 as well as leg element 60 in such a manner that they are substantially located in one plane. However, they may be arranged in such a manner that they are not located in one plane.

Sensors 45, 46, 47 are each laser distance sensors, which are adapted to measure a distance along a respective measurement direction 45a, 46a, 47a with respect to an object, in particular an edge of a plate element of a wafer boat according to FIGS. 1 to 4. Such sensors measure in a known manner laser beams reflected on the respective object, wherein the sensors are preferably directed at right angles to the surface of the object.

The sensors 46, 47 are laterally spaced to each other with a distance corresponding approximately to the width of the respective segments of wafer boat 1 according to FIGS. 1 to 4. Sensor 45 is inclined according to the inclined portion or chamfer of groove 12.

Figure 6:
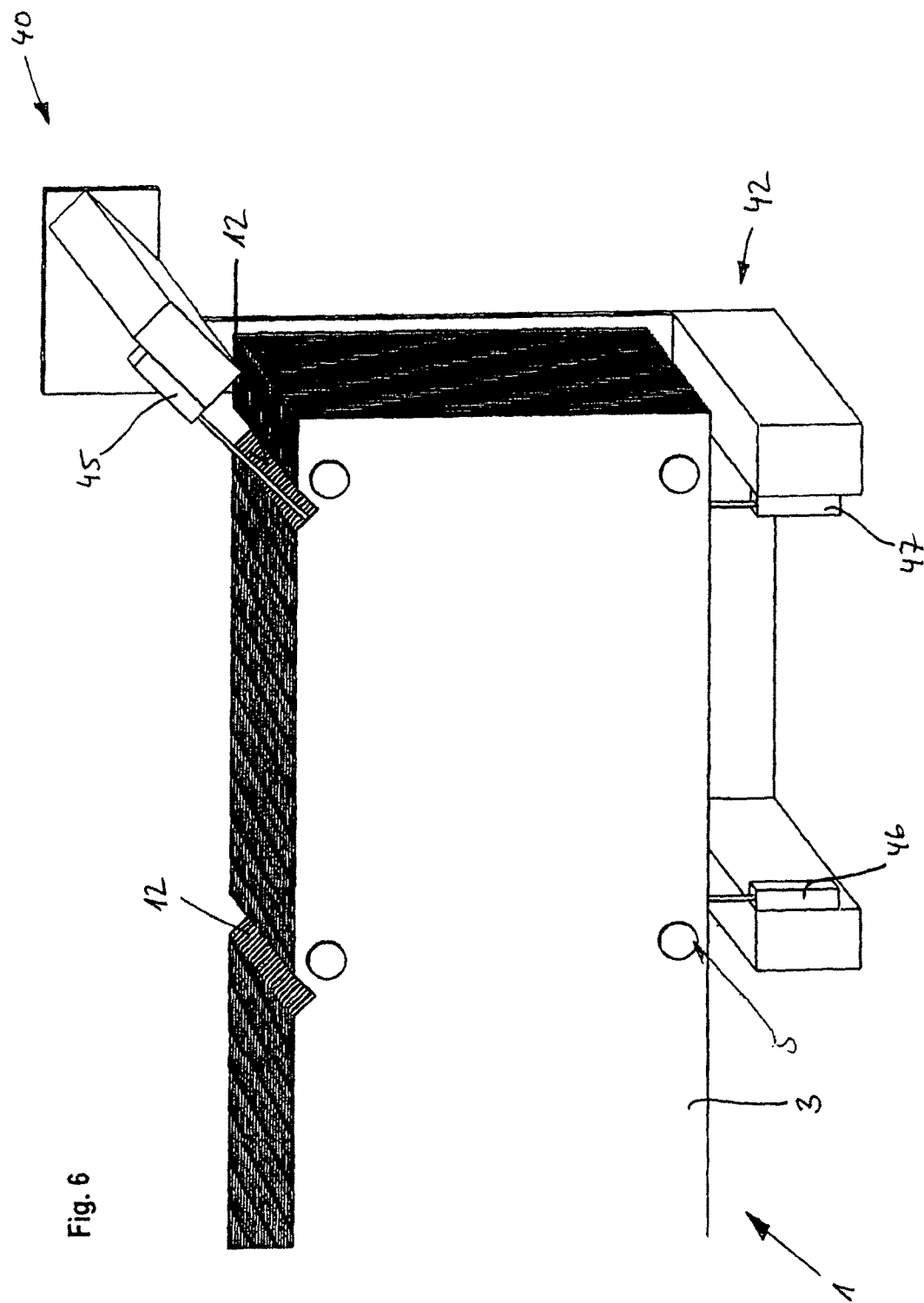
FIG. 6 is a diagrammatic perspective view of the apparatus of FIG. 5 when measuring a wafer boat of FIG. 1.
Figure 7:
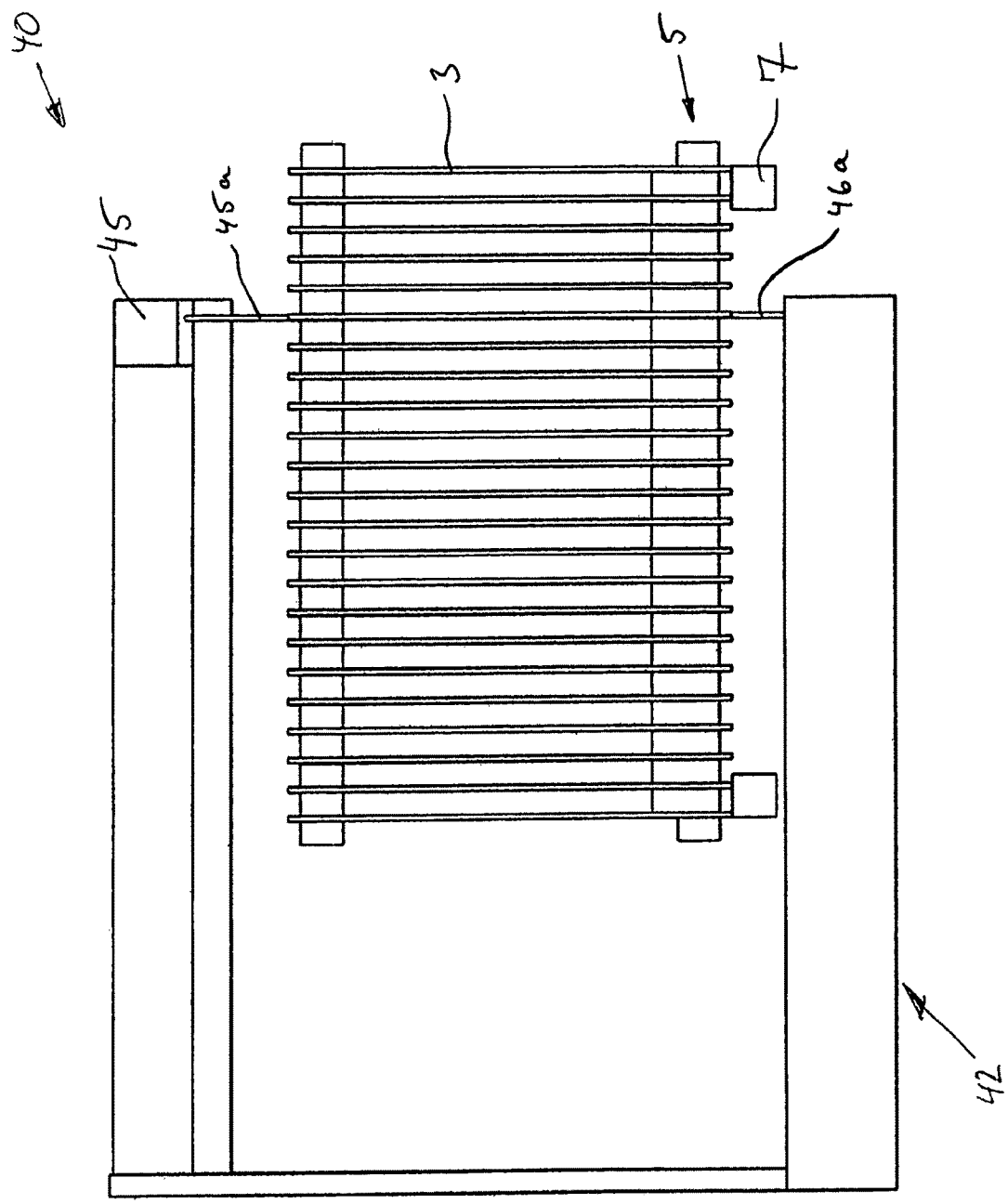
FIG. 7 is a diagrammatic side view of the apparatus of FIG. 5 when measuring a wafer boat of FIG. 1.
Figure 8:
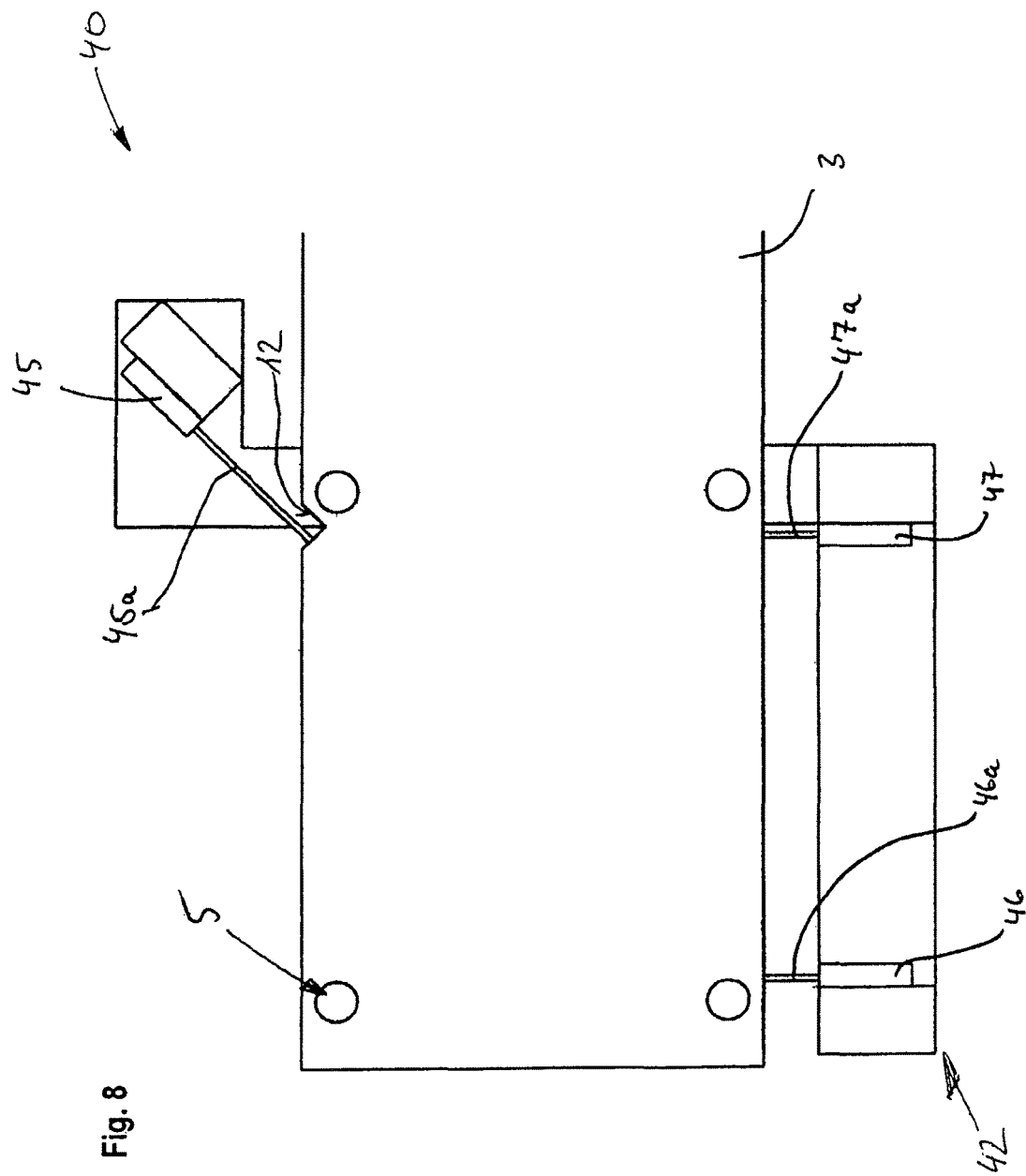
FIG. 8 is a diagrammatic front view of the measuring apparatus of FIG. 5 when measuring a section of a wafer boat of FIG. 1.

FIGS. 6 to 8 show different views of apparatus 40 when measuring a wafer boat 1, wherein only sections of wafer boat 1 are shown in FIGS. 6 to 8. In particular, FIG. 6 shows a diagrammatic perspective view, FIG. 7 shows a diagrammatic side view and FIG. 8 shows a schematic front view of apparatus 40 when measuring wafer boat 1.

FIG. 6 shows the measurement of a first plate element 3 in the area of a segment located on the outer right side of the first plate element. The apparatus 40 has an orientation with respect to wafer boat 1, so that the first sensor 45 is directed substantially perpendicularly at an inclined portion or a chamfer of groove 12, while the second and third sensors 46, 47 have a substantially perpendicular orientation with respect to a bottom edge of plate element 3. During a measurement of the respective plate elements 3 the sensors 45, 46, 47 are moved by means of a movement unit for carrier element 42, which is not illustrated in more detail, substantially perpendicular to the plane of the plate elements 3 across the plate elements. The movement of the movement unit and thus the position of the respective sensors within the movement direction is determined by one or more encoders. During the movement of the sensors output signals of the sensors depending on the value of the encoder are generated, such as those shown in FIG. 12. Here FIG. 12A shows an exemplary output signal of a distance sensor depending on an encoder value during the movement of the sensors across several plate elements 3. FIG. 12B shows an enlarged section of the sensor signals during the movement of a sensor across a plate element 3.

The output signals of the sensors are on a first (upper) level 70 if no plate element is within the field of view of the sensor and on a second (lower) level 71, if a plate element 3 is within the field of view of the sensor. The transitions between the first and the second level are formed by corresponding edges 73, 74 of the sensor signals, wherein the respective edge 73 marks the entry of plate element 3 into the sensor's field of vision when transitioning from the first level 70 to the second level 71, and edge 74 indicates the exit of plate element 3 out of the sensor's field of vision when transitioning from the second level 71 to the first level 70. Even with the respective levels 70, 71 and the edges 73, 74 being illustrated as forming a perfect square wave, it will be clear to the person skilled in the art that in reality signals do not take on this perfect shape. However, average values may be calculated for the respective levels for a determination of the distance. Edge recognition may be done e.g. by a determination of threshold values.

By means of the height of the second level 71 the distance of a corresponding edge of plate element 3 to the sensor may be determined. By means of the edges 73, 74 in relation to the corresponding encoder values of the sensors the position of the edges along a direction of movement of the sensors may be determined.

Thus, the location of plate elements 3 at least in the range of the respective measured segment A-G may then be determined by means of these distance data for the individual sensors as well as the position data of the individual edges. In particular the location in relation to a desired position (i.e. a perfectly oriented position) may be determined.

Figure 9:
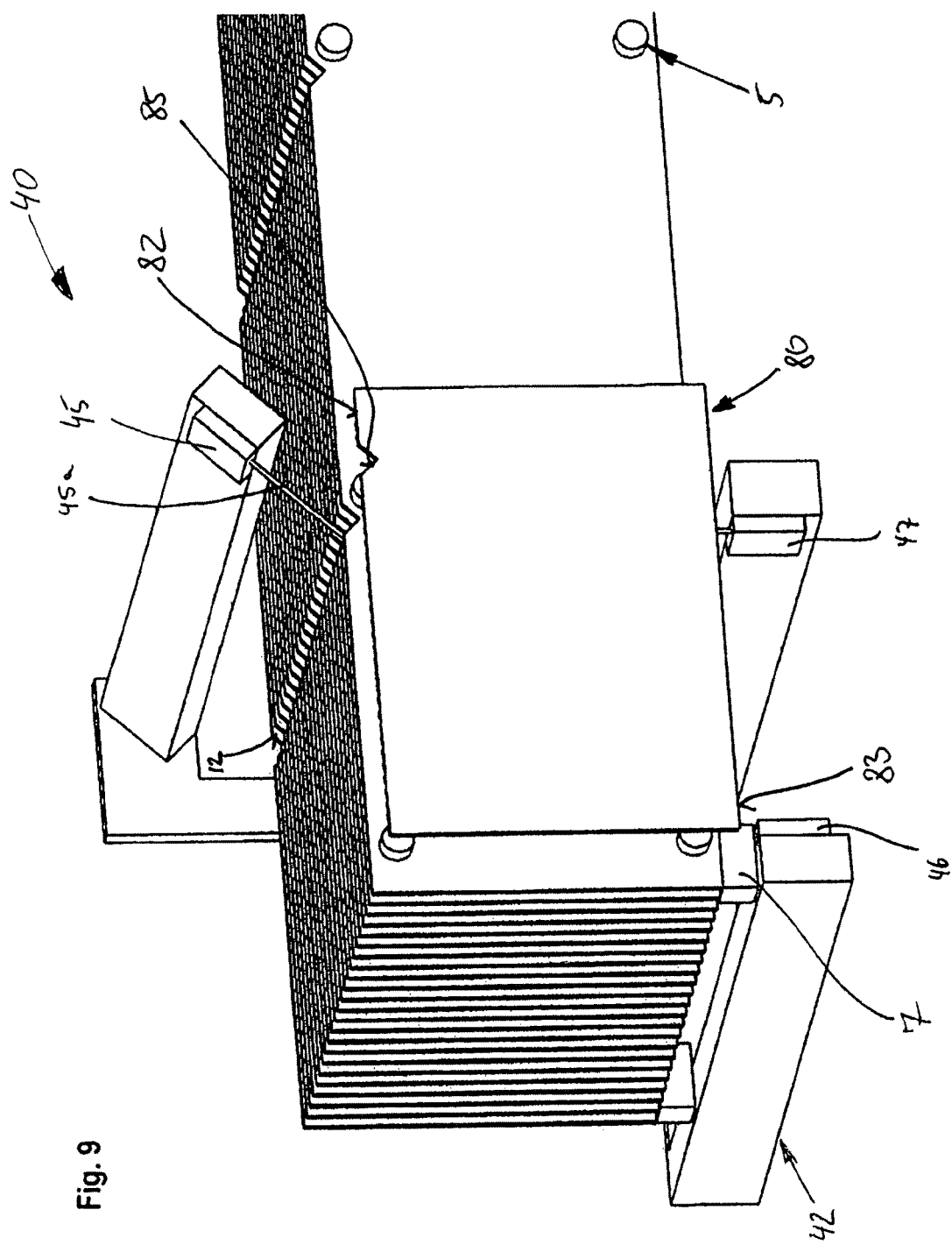
FIG. 9 is a diagrammatic perspective view of an alternative apparatus for determining the location of plate elements of a wafer boat of FIG. 1.
Figure 10:
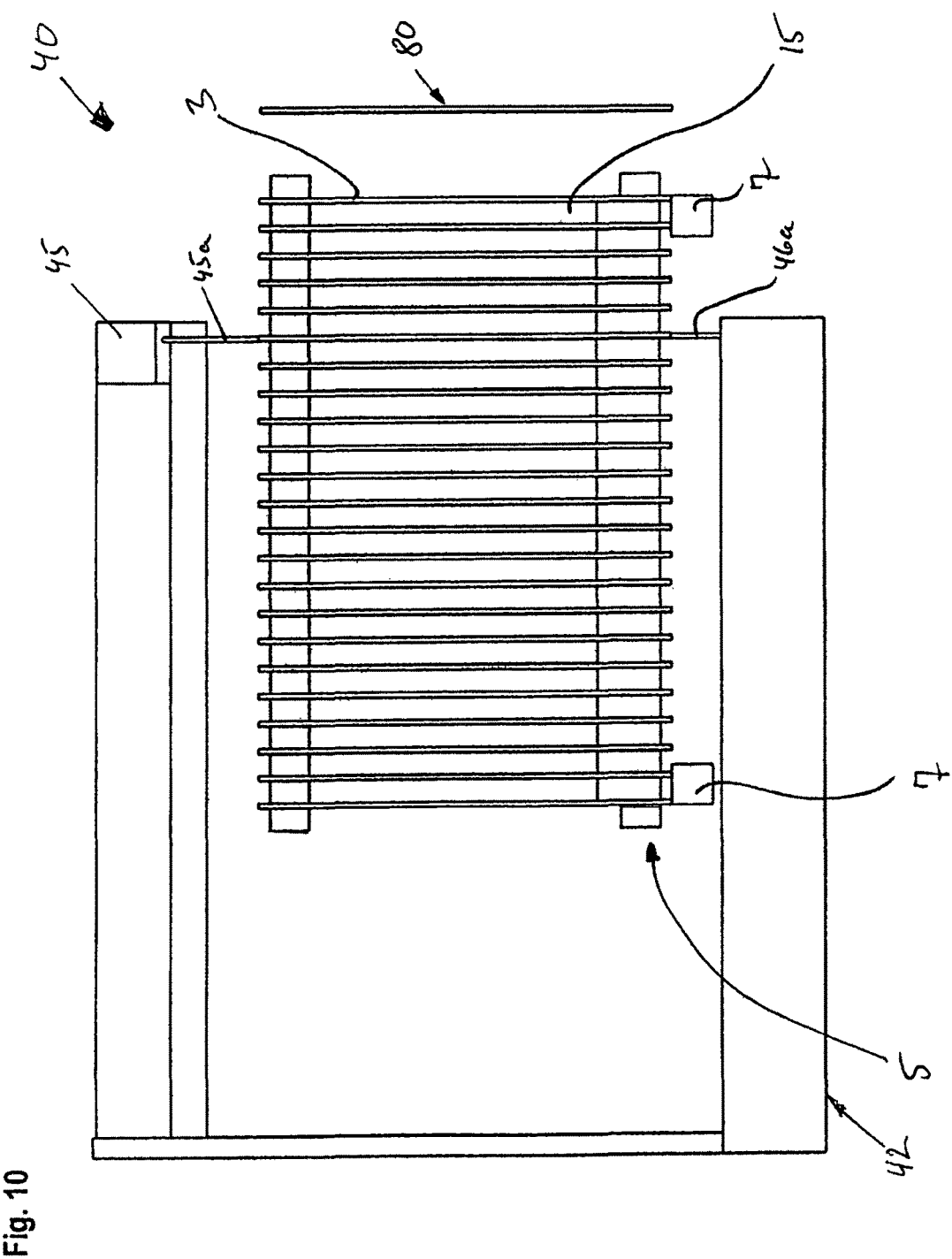
FIG. 10 is a diagrammatic side view of the apparatus of FIG. 9.

FIGS. 9 and 10 show different views of an alternative apparatus 40 for determining the location of plate elements 3 in a wafer boat 1 according to FIGS. 1 to 4. FIG. 9 shows a diagrammatic perspective view, and FIG. 10 a diagrammatic side view. In FIGS. 9 and 10 the same reference numerals are used as above when the same or similar elements are described.

Apparatus 40 has substantially the same design as described above, however it has an additional element in the form of a reference plate 80 kept in a predefined position by a device that is not shown in detail.

The reference plate 80 has a top edge 82 as well as a bottom edge 83 extending parallel. The reference plate 80 has a width and height according to a width and height of a segment of a plate element 3. Of course it is possible to form reference plate 80 longer, e.g. corresponding to the length of a complete plate element 3. In the top edge 82 a groove 85 is formed corresponding to groove 12 in the top edge 9 of plate element 3.

With reference plate 80 being positioned in a predefined position it is possible to measure the reference plate 80 prior to measuring the plate elements 3 of a wafer boat 1, and then to measure the respective segments of plate elements 3. Thus, the relative position of individual plate elements 3 in relation to reference plate 80 may be determined. By measuring reference plate 80, the positions of carrier 40 and the individual sensors may be calibrated. It is also possible to determine by means of such a reference plate 80 the exact position of the wafer boat on a sliding carriage, which is carrying or moving the wafer boat 1. In particular, such effects as temperature drifts of the sensors may be compensated during such a calibration.

The operation of apparatus 40 for measuring the location of plate elements 3 of a wafer boat 1 is discussed in more detail with respect to the figures below. Here it is also referred to the FIG. 11A to 11C and 13A and 13B, which first present a diagrammatic front view of apparatus 40 when measuring different segments A-G of a wafer boat 1 and then a diagrammatic front view of an apparatus when determining the location of a plate element on a wafer boat shifted in a lateral direction, as well as an enlarged view of a sensor signal of the apparatus.

Before measuring the location of plate element 3 of a wafer boat 1 first a segment A-G of plate element 3 is oriented or aligned to carrier element 42. An orientation is done in a manner that the sensor 45 moves across the top edge 9 in the area of groove 12 as the carrier element moves perpendicularly to the plane of plate elements 3. With a corresponding movement the sensors 46, 47 move across the bottom edge 10 of plate elements 3 in the range of segment A-G to be measured. According to FIG. 11, a first segment A of wafer boat 1 located on the outer left side is measured, in a second step segment B, located to the right of segment A (FIG. 11B) is measured and in a third step (FIG. 11C) segment C, again to the right of segment B, is measured. In this manner all seven segments A-G may be measured one after another. During the measurement of the individual elements either apparatus 40 may be shifted laterally or sideways, or wafer boat 1 is shifted laterally with respect to apparatus 40.

As can be seen, sensor element 45 is located above and sideways with respect to the segment A-G to be measured when measuring a respective segment A-G. Thus it is possible for a loading/unloading robot (not shown) to access a respective receiving slot 15 while measuring the respective plate element 3 so as to insert a wafer into the group of guiding elements of plate element 3 being measured in this moment or to remove a wafer therefrom. Thus it is possible to carry out a loading or unloading of wafers adjacent to the respective plate element 3 immediately following a determination of the location of a respective plate element 3 within a segment A-G.

Of course it is also possible to first measure a complete segment A-G of wafer boat 1 and then to transmit the information to a loading/unloading robot for carrying out corresponding loading and unloading operations. However, it is preferable to carry out loading and unloading operations directly successive to the measurement of plate elements 3, since this may greatly reduce the danger of positional changes in the meantime.

During the relative movement of sensors 45, 46, 47 perpendicular to plate elements 3 corresponding sensor values are generated for the respective sensors, which in turn may be used when determining the location of the corresponding plate elements 3, in particular with respect to an assumed desired position. FIG. 13A shows a segment of a plate element 3 that is shifted laterally with respect to a desired position, but is otherwise precisely positioned. Here a desired position is shown by a dashed line.

With such a lateral shift and otherwise exact positioning of the wafer boat the sensor signals of the sensors 46, 47 will coincide with the desired sensor signals. In particular edges or signal edges 73, 74 will occur at expected encoder values, and a second level 71 will be on an expected level.

However, the sensor signal of sensor 45 will deviate from the expected sensor signal. The edges 73, 74 will occur at the expected times, i.e. at the expected encoder values, but the second level will be on a different level, since sensor 45 will measure the distance to a different position of groove 12 than the expected position. Thus a different distance to the edge of groove 12 is determined, which will be illustrated in a different height of the second level 71. This is shown in FIG. 13b, wherein the dashed line of level 71 represents the expected height, while the solid line represents the actual level 71. By means of this difference the change in distance may be measured, and by means of the distance measurement then the lateral or sideways shift of wafer boat 1 may be determined with the help of the known dimensions. The determined location is then transmitted to a loading/unloading robot that may control a loading/unloading handler accordingly so as to load/unload the receiving slots 15. In particular a loading and/or unloading of a receiving slot 15 adjacent to a plate element 3 may be carried out immediately after determining its location. Thus a loading and/or unloading of the receiving slots 15 may be carried out immediately following the respective determination of the location of plate elements 3 forming the receiving slot 15 there between. However, it is also possible to first measure all plate elements 3 within a segment A-G and to then initiate the loading and/or unloading of the receiving slots 15 segment by segment, wherein during the time of the loading/unloading an adjacent segment A-G could be measured.

FIG. 13 shows only one example, how a location of plate element 3 may be determined with respect to an expected desired position.

A perpendicular shift of the wafer boat 1, i.e. a shift perpendicular to plate elements 3, may e.g. be determined by the position of the respective edges 73, 74 of the sensor signals of sensors 45, 46 and 47.

A shift in height of wafer boat 1 (in the plane of the plate elements) may be for example determined by means of the distance information, i.e. the heights of the second level 71 of the respective sensor signals of sensors 45, 46 and 47. Shifts in height on one side (in the longitudinal direction of the wafer boat one side is located higher) may also be determined by means of the distance information of the sensor signals of sensors 45, 46 and 47.

Diagonal shifts, i.e. perpendicular to a longitudinal center plane of wafer boat 1, may be determined by means of the edges 73, 74 of the respective sensor signals of at least two sensors distanced in a lateral direction, i.e. such as sensors 45 and 46 or sensors 46 and 47. Of course the edge information of all sensors may be used.

The lateral inclination of wafer boat 1, i.e. the inclination across a width of wafer boat 1, could for example be determined via the edge information of the respective sensors, since the edge information of the upper sensor 45 would indicate a shift into a first direction, and the edge information of the sensors 46 and 47 would show a lateral shift into the other direction. Of course more complex and overlaying shifts could be determined.

If the apparatus is used in combination with a reference plate, the reference plate may be used for calibrating the measurement device prior to a respective series of measurements.

FIG. 14 is a diagrammatic perspective view of a portion of an alternative plate element 3 having top and bottom edges 9 and 10, respectively. The plate element 3 may be one of a plurality of plate elements forming a wafer boat 1 shown in FIG. 1. The portion shown in FIG. 14 may correspond to one segment of the plate element such as a segment A-G previously described.

A groove 80 having parallel side walls and a rounded bottom is formed in the top edge 9. Adjacent to the groove 80, an inclined portion or chamfer 82 is formed. The chamfer 82 extends along a predetermined section of the top edge 9 and is inclined at an angle of <90°, preferably around 45°, with respect to the side face of the plate elements.

A groove 84 having straight sides forming an angle of for example 90° is formed in the bottom edge 10 of the plate element.

Providing at least one of these contours on the top edge 9 and one on the bottom edge 10 of the plate elements 3 enables the use of only two 2D sensors for determining the position of the plate element 3. With one 2D sensor being directed onto the top edge 9 and one 2D sensor being directed onto the bottom edge 10, an image may be compared to a reference image, which may be initially generated using a reference wafer boat. Based on this comparison, the position of the plate element may be determined. Preferably, multiple contours are provided at the top or bottom edge 9 or 10 to enable determination of all six degrees of freedom of the plate element. Such contours may be provided for each laterally spaced segment of the plate element 3.

The apparatus was discussed in detail with respect to preferred embodiments of the invention with reference to the invention, without being limited to the shown embodiments.

In particular the number of plate elements and the partition into different segments may differ from the shown form. For example it may also be possible to mount each sensor on an individual carrier element that may be moved along predetermined travel paths by means of appropriate movement units.

The invention claimed is:

1. A method for determining the location of plate elements of a wafer boat having a plurality of plate elements that are arranged substantially parallel to each other and each comprise a top and bottom edge, the method comprising the following steps:
   placing or arranging the wafer boat in a predetermined orientation;
   moving a sensor array comprising at least first, second, and third sensors along predetermined first, second, and third travel paths perpendicular to the plate elements, wherein the first travel path is above the wafer boat, the second travel path is below the wafer boat and the third travel path is laterally spaced from the first or second travel path above or below the wafer boat, and wherein each of the sensors is directed at either the top or bottom edge of the plate elements;
   continuously determining the position of the sensors along the corresponding travel path and determining the positions in which a respective plate element enters and exits the measuring area of a sensor;
   measuring the distance between a respective sensor and one of the top and bottom edge of the plate element; and
   determining the location of a respective plate element by means of the sensors.

2. The method according to claim 1, wherein at least one inclined portion or chamfer in the form of a protrusion or a recess being formed on at least one of the top and bottom edge of each plate element, and at least the first sensor being oriented in such a way that the direction of measurement is substantially perpendicular to the inclined portion or chamfer.

3. The method according to claim 1, wherein the top edge and the bottom edge of each plate element are substantially parallel to one another, and the second and third sensors being oriented in such a way that their direction of measurement is substantially perpendicular to the top or bottom edge of the plate elements.

4. The method according to claim 1, wherein the sensors being moved substantially perpendicular to the plate elements.

5. The method according to claim 1, wherein the first sensor being moved along the first travel path.

6. The method according to claim 1, wherein the second sensor being moved along the second travel path and the third sensor being moved along the third travel path, wherein the third travel path is below the wafer boat.

7. The method according to claim 1, wherein the sensors being moveable by means of a common carrier.

8. The method according to claim 1, wherein the sensors first being moved across a reference plate having top and bottom edges corresponding to the plate elements for calibration purposes, wherein it is determined during the movement at which position along the respective travel path the sensors detect an entry and exit of the top or bottom edge of the reference plate into and out of a measuring area of the sensors, and wherein the distance between a respective sensor and a respective top/bottom edge of the reference plate is measured.

9. The method according to claim 8, wherein the reference plate having substantially parallel top and bottom edges and/or having at least one inclined portion or chamfer on the top or bottom edge in the form of a protrusion or a recess.

10. The method according to claim 8, wherein the detection of the entry and/or exit of the plate elements and/or the reference plate being done by means of a determination of threshold values.

11. The method according to claim 8, wherein the direction of measurement of the first sensor with respect to the top or bottom edge of the plate element and/or the reference plate is inclined by 45°.

12. The method according to claim 1, wherein segments of the wafer boat that are laterally spaced being measured sequentially.

13. The method according to claim 12, wherein the wafer boat being moved laterally between measuring laterally adjacent segments, so as to move the respective segment into a range of movement of the sensors.

* * * * *